(12) United States Patent
Shimoda et al.

(10) Patent No.: US 7,218,584 B2
(45) Date of Patent: May 15, 2007

(54) INFORMATION RECORDING AND REPRODUCING APPARATUS

(75) Inventors: Yoshitaka Shimoda, Saitama (JP); Akira Shimizu, Saitama (JP); Yuji Tawaragi, Saitama (JP)

(73) Assignee: Pioneer Corporation, Tokyo (JP)

( * ) Notice: Subject to any disclaimer, the term of this patent is extended or adjusted under 35 U.S.C. 154(b) by 536 days.

(21) Appl. No.: 10/851,219

(22) Filed: May 24, 2004

(65) Prior Publication Data
US 2004/0240349 A1    Dec. 2, 2004

(30) Foreign Application Priority Data
May 23, 2003    (JP) .............................. 2003-146679

(51) Int. Cl.
*G11B 7/00*    (2006.01)
(52) U.S. Cl. .................................. 369/47.27; 369/44.13
(58) Field of Classification Search ............. 369/44.27, 369/44.28, 44.13, 47.27, 275.3, 47.1, 44.26
See application file for complete search history.

(56) References Cited
U.S. PATENT DOCUMENTS
4,748,609 A *   5/1988   Yonezawa et al. ........ 369/44.13

FOREIGN PATENT DOCUMENTS
JP    11-345462    12/1999

\* cited by examiner

*Primary Examiner*—Nabil Hindi
(74) *Attorney, Agent, or Firm*—Young & Thompson

(57) ABSTRACT

An information recording and reproducing apparatus performs information recording and reproducing on an optical disc having a recording track wobbled by a predetermined frequency. The apparatus includes an optical pickup which irradiates a laser light on the optical disc and receives the laser light reflected by the optical disc to output an electric signal corresponding to the laser light, a push-pull signal generating unit which includes a sample-hold unit and generates the sample-hold push-pull signal and the non-sample-hold push-pull signal from the electric signal, a sample-hold circuit which samples and holds the push-pull signal, a recording clock generating unit which generates a recording clock synchronized with the wobble signal based on the sample-hold push-pull signal during recording and based on the non-sample-hold push-pull signal during reproduction, and a phase adjusting unit which adjusts the phases of the non-sample-hold push-pull signal and the sample-hold push-pull signal.

9 Claims, 11 Drawing Sheets

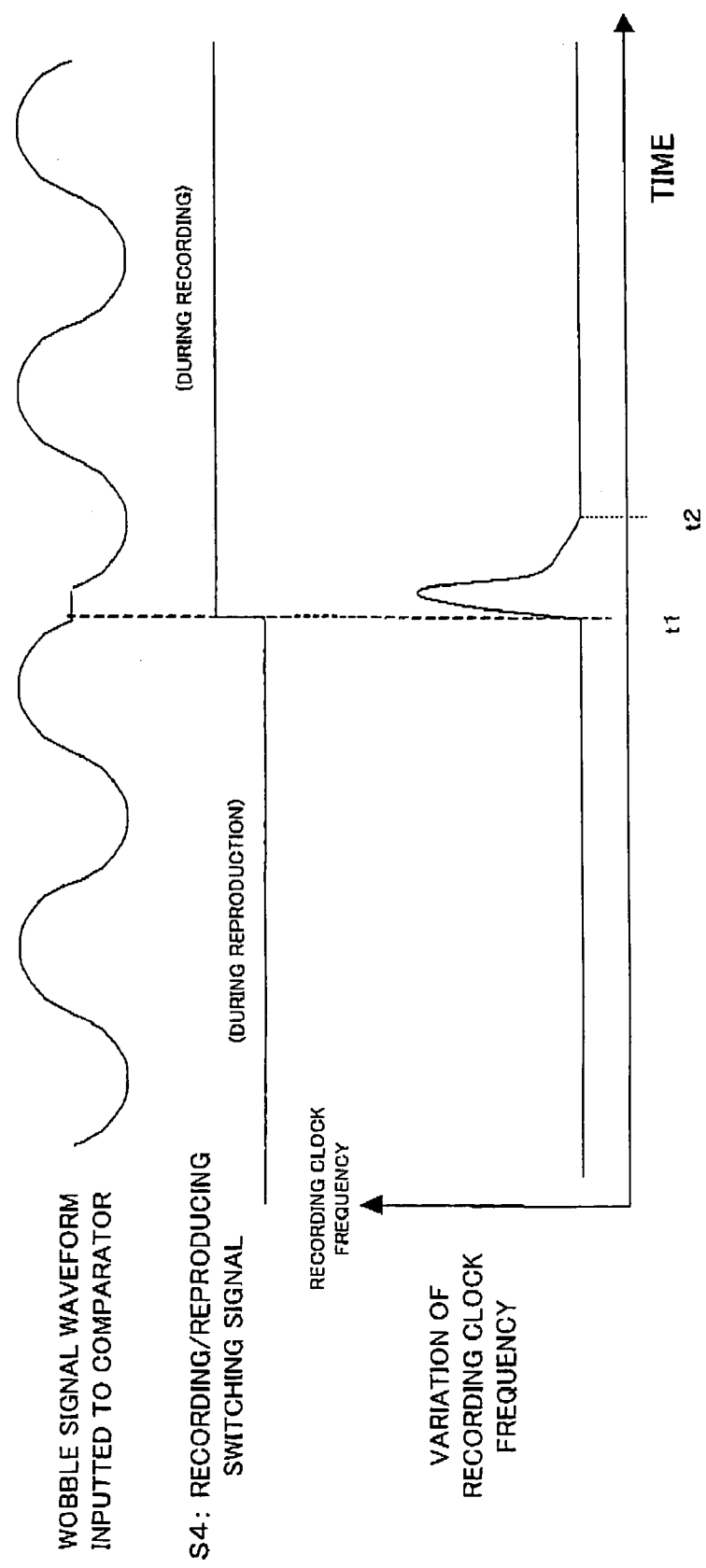

INFORMATION RECORDING AND REPRODUCING APPARATUS

BACKGROUND OF THE INVENTION

1. Field of the Invention

The present invention relates to an information recording and reproducing apparatus which records information on an optical disc and reproduces the recorded information.

2. Description of Related Art

There is known an information recording and reproducing apparatus which records information on an optical disc, such as a DVD-R/RW, and reproduces the recorded information. On an information recording surface of the optical disc such as the DVD-R/RW, groove tracks serving as recording tracks and land tracks neighboring the groove tracks are formed. The land track has a function as a guide track for irradiating a light beam for recording or reproduction to the groove track. On the land track, prepits indicating pre-information including address information on the optical disc and the like are formed. Further, the groove track is wobbled at a frequency corresponding to a rated rotation speed of the optical disc. The prepits and the wobbled groove tracks are preformed before the shipment of the optical disc from a factory.

At the time of recording information, the information recording and reproducing apparatus of the optical disc such as the DVD-R/RW, detects a wobble signal indicating a wobble frequency of the above-mentioned groove track, and controls the rotation of the optical disc to be a predetermined speed based on the wobble signal. Also, the information recording and reproducing apparatus detects the prepits on the optical disc and obtains the pre-information. The information recording and reproducing apparatus sets optimum output of the light beam based on the pre-information, and obtains the address information on the optical disc from the pre-information to determine a recording position of the recording information on the optical disc, and then records the information.

The above-mentioned information recording and reproducing apparatus emits the light beam for recording and reproducing the information by an optical pickup, and receives a return light from the optical disc to output an electric signal. The wobble signal having the wobble frequency of the land track is generated from the electric signal outputted from the optical pickup, and a recording clock signal for recording the information is generated based on the wobble signal. More concretely, at the time of recording the information, a wobble signal level in a space portion of the recording signal is sampled by a sample-hold circuit, and the sampled level is held in a mark portion of the recording signal. Based on the output of the sample-hold circuit, the recording clock signal is generated. On the other hand, at the time of reproducing the information, the recording clock signal is generated based on the wobble signal without utilizing the sample-hold circuit.

Japanese Patent Application Laid-open under No. 11-345462 discloses a method that the recording clock signal is generated based on the wobble signal as explained above, and the information is recorded on the optical disc by utilizing the recording clock signal (it is also called "synchronized recording").

However, if the sample-hold process is applied to the wobble signal detected from the optical disc in recording the information, phase delay occurs to the wobble signal after the sample-hold process due to an aperture. On the other hand, since the sample-hold process is not applied to the wobble signal in reproducing the information, the phase delay does not occur. Therefore, when the mode of the information recording and reproducing apparatus changes from an information reproducing mode to an information recording mode, a phase deviation occurs to the wobble signal which is a source of generating the recording clock signal. Variation of the frequency temporarily occurs to the generated recording clock signal due to the phase deviation, and the recording clock signal becomes unstable. Since information recording on the optical disc is performed in synchronism with the recording clock signal, accuracy of information recording on the optical disc decreases if the recording clock signal is unstable. As a result, problems such as deterioration of a reproducing error rate may occur in reproduction. Namely, at the time of changing the mode from the information reproducing mode to the information recording mode, the information recording temporarily becomes unstable, and the recording accuracy can decrease.

SUMMARY OF THE INVENTION

The present invention has been achieved in order to solve the above problems. It is an object of this invention to provide an information recording and reproducing apparatus capable of stably generating a recording clock and performing synchronized recording with high accuracy even at a time of transition from reproduction to recording.

According to one aspect of the present invention, there is provided an information recording and reproducing apparatus of an optical disc including a recording track wobbled by a predetermined frequency, including an optical pickup which irradiates a laser light on the optical disc and receives the laser light reflected by the optical disc to output an electric signal corresponding to the laser light, a push-pull signal generating unit which includes a sample-hold unit for executing sample-hold process, and generates a non-sample-hold push-pull signal and a sample-hold push-pull signal from the electric signal, the push-pull signal including a wobble signal component of the recording track, a recording clock generating unit which generates a recording clock synchronized with the wobble signal based on the sample-hold push-pull signal during recording and based on the non-sample-hold push-pull signal during reproduction, and a phase adjusting unit which adjusts phases of the non-sample-hold push-pull signal and the sample-hold push-pull signal.

The above-mentioned information recording and reproducing apparatus performs recording and reproduction of the information to and from the optical disc having the recording track wobbled by the predetermined frequency, such as a DVD-R and a DVD-RW. The optical pickup irradiates, to the optical disc, the laser light serving as the recording light or the reproducing light, and receives the return light by a photodetector or the like to output an electric signal corresponding to a received light quantity. Based on the electric signal, the push-pull signal is generated. The push-pull signal may be calculated as a difference of a return light quantity from both sides in a radius direction of the recording track of the optical disc, and includes wobble signal component of the recording track. Therefore, the recording clock synchronized with the wobble signal is generated by a PLL circuit, for example, based on the push-pull signal.

The recording clock is generated by utilizing the sample-hold push-pull signal for removing a light modulating component by a recording pulse waveform during recording, and is generated by utilizing the non-sample-hold push-pull signal during reproduction. However, since a phase delay is caused by the sample-hold process, a deviation occurs to the phases of the recording clock signal during recording and reproduction. Therefore, the phases of the sample-hold push-pull signal and the non-sample-hold push-pull signal are adjusted by the phase adjusting unit. Thereby, the deviation of the phases of the recording clock signals during recording and reproduction can be removed. Thus, it is possible to prevent the fluctuation of the recording clock at the time of switching from the reproducing mode to the recording mode, and the recording can be stably performed with high accuracy.

The phase adjusting unit may be a delay circuit which delays the non-sample-hold push-pull signal by a delay quantity corresponding to a phase delay quantity caused by the sample-hold process. Thereby, the phases of the sample-hold push-pull signal and the push-pull signal delayed by the delay circuit can be adjusted.

The information recording and reproducing apparatus may include a switching unit which supplies the sample hold push-pull signal to the recording clock generating unit during recording and supplies an output signal of the delay circuit to the recording clock generating unit during reproduction. By the switching unit, it is possible to switch the push-pull signal utilized for generating the recording clock during recording and reproduction.

The delay quantity of the delay circuit may be set in association with a hold period in the sample-hold process. The hold period length in the sample hold processing affects the phase delay quantity caused by the sample-hold process. Therefore, if the delay quantity of the delay circuit is set in association with the hold period in the sample-hold process, an appropriate delay quantity can be set.

The phase adjusting unit may include a unit which measures the phase delay quantity caused by the sample-hold process during recording, and a unit which sets the delay quantity of the delay circuit based on the measured phase delay quantity. In this case, since the phase delay quantity caused by the sample-hold process is measured during actual recording, the delay quantity of the delay circuit can be varied correspondingly to the measured value. Therefore, it becomes possible to always set the appropriate delay quantity.

In an embodiment, the recording clock generating unit may include a wobble signal generating unit which generates the wobble signal from the push-pull signal, and a PLL circuit which generates the clock signal synchronized with the wobble signal. The PLL circuit may include a phase comparator which compares the phases of the wobble signal and a frequency dividing signal of the recording clock signal, and an oscillator which varies a frequency of the recording clock signal in accordance with the output signal of the phase comparator. The phase adjusting unit may include an adder which adds, to the output signal of the phase comparator, an offset voltage corresponding to the phase delay quantity caused by the sample-hold process during recording.

In this case, the wobble signal is generated from the push-pull signal, and the recording clock signal is generated by the PLL circuit based on the wobble signal. The PLL circuit establishes a phase synchronization of the wobble signal and the recording clock signal. Since the wobble signal is generated based on the sample-hold push-pull signal during recording, a delay occurs to the phase of the wobble signal. However, by adding the offset voltage corresponding to the delay quantity to the output of the phase comparator, the phase delay quantity is corrected in the PLL.

Thereby, an effect of the phase delay caused by the sample-hold process is removed, and stable generation of the recording clock is possible.

In another embodiment, the recording clock generating unit may include a wobble signal generating unit which generates the wobble signal from the push-pull signal, and the PLL circuit which generates the clock signal synchronized with the wobble signal. The PLL circuit may include the phase comparator which compares the phases of the wobble signal and the frequency dividing signal of the recording clock signal, and the oscillator which varies the frequency of the recording clock signal in accordance with the output signal of the phase comparator. The phase adjusting unit may include a phase shifter which shifts the phase of the frequency dividing signal by the phase quantity corresponding to the phase delay quantity caused by the sample-hold process during recording.

In this case, the wobble signal is generated from the push-pull signal, and the recording clock signal is generated by the PLL circuit based on the wobble signal. The PLL circuit establishes the phase synchronization of the wobble signal and the recording clock signal. Since the wobble signal is generated based on the sample-hold push-pull signal during recording, a delay occurs to the phase of the wobble signal. However, by giving a phase shift, to a frequency dividing signal of the recording clock, of the phase quantity corresponding to the delay quantity, the phase delay quantity is corrected in the PLL. Thereby, the effect due to the phase delay by the sample-hold process is removed, and the stable generation of the recording clock is possible.

The push-pull signal generating unit may generate the push-pull signal from the electric signal, and samples and holds the generated push-pull signal by the sample-hold unit to generate the sample-hold push-pull signal. Instead, the push-pull signal generating unit may samples and holds the electric signal by the sample-hold unit to generate a sample-hold electric signal, and may generate the sample-hold push-pull signal from the sample-hold electric signal.

The nature, utility, and further features of this invention will be more clearly apparent from the following detailed description with respect to preferred embodiment of the invention when read in conjunction with the accompanying drawings briefly described below.

BRIEF DESCRIPTION OF THE DRAWINGS

FIG. 5 is a diagram explaining a fluctuation of a recording clock caused by a phase delay at a starting time of recording.

DETAILED DESCRIPTION OF THE PREFERRED EMBODIMENTS

The preferred embodiments of the present invention will now be described below with reference to the attached drawings.

[1st Embodiment]

Figure 1:
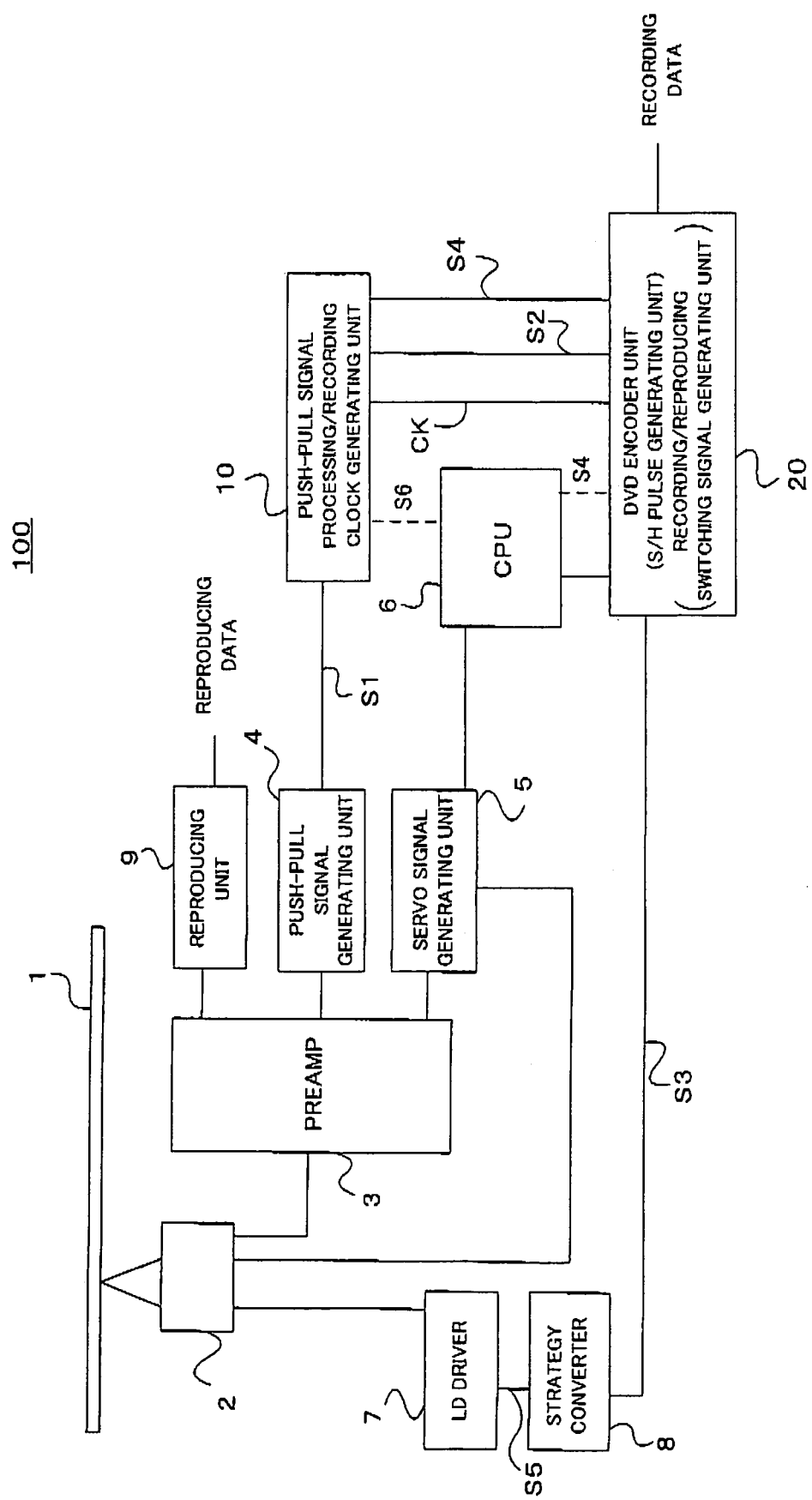
FIG. 1 is a block diagram showing a schematic configuration of an information recording and reproducing apparatus according to the present invention.

FIG. 1 shows a schematic configuration of an information recording and reproducing apparatus according to a first embodiment of the present invention. The information recording and reproducing apparatus according to the present invention records the information on the optical disc such as the DVD-R and the DVD-RW, and reproduces the recorded information. However, since the present invention is specially characterized in generating the recording clock during information recording, FIG. 1 mainly shows configuration components related to the information recording, and detailed illustration and explanation of the configuration components related to information reproduction are omitted.

As shown in FIG. 1, an information recording and reproducing apparatus 100 includes an optical pickup 2, a preamplifier 3, a push-pull signal generating unit 4, a servo signal generating unit 5, a CPU 6, an LD driver 7, a strategy converter 8, a reproducing system 9, a push-pull signal processing/recording clock generating unit 10 (hereafter, it is simply called "recording clock generating unit") and a DVD encoder unit 20.

The optical pickup 2 includes a light source such as the laser diode, and a photodetector. The optical pickup 2 irradiates a laser light, serving as a recording light and a reproducing light, emitted from the light source on the optical disc 1, and receives the return light from the optical disc 1 by the photodetector to output an electric signal corresponding to the received light quantity. As the photodetector, for example, a quadruple photodetector having four light-receiving elements, which are arranged respectively in line in the radial direction and in the tangential direction of the optical disc 1, is utilized. The photodetector of the optical pickup 1 supplies, to the preamplifier 3, the electric signal corresponding to each of the received light quantity of four light-receiving elements.

The preamplifier 3 amplifies the electric signals from the light-receiving elements, and supplies the signals to each of the push-pull signal generating unit 4, the servo signal generating unit 5 and the reproducing system 9.

The push-pull signal generating unit 4 calculates each of the sums of the electric signals from two light-receiving elements, arranged in line in the tangential direction, of four light-receiving elements of the photodetector, and supplies, to the recording clock generating unit 10, the difference of those two sum signals as a so-called push-pull signal S1. The push-pull signal S1 includes the wobble signal indicating wobbling of the groove track on the optical disc 1. For example, in the case of the DVD-R, the frequency of the wobble signal is 140.65 KHz.

The servo signal generating unit 5 receives the electric signal from four light-receiving elements of the photodetector, and generates various servo signals, such as a focus servo signal, a tracking servo signal, a sled servo signal, a spindle servo signal and the like by a predetermined arithmetic operation. Based on those servo signals, the servo signal generating unit 5 controls a slider mechanism of the optical pickup 2, an actuator and a spindle motor which controls the rotation of the optical disc 1.

The DVD encoder unit 20 includes an encoder, a sample-hold (hereafter, it is expressed by "S/H") pulse generating unit, a recording/reproducing switching signal generating unit and the like. The encoder in the DVD encoder unit 20 receives recording data from the outside, and generates an NRZI signal, which corresponds to the recording data and which is synchronized with the recording clock CK, to supply the NRZI signal to the strategy converter 8. The S/H pulse generating unit generates a S/H pulse signal S2 indicating the mark period and the space period of the recording data, and supplies the signal to the recording clock generating unit 10. Based on a recording/reproducing instruction from the CPU 6, the recording/reproducing switching signal generating unit in the DVD encoder unit 20 generates a recording/reproducing switching signal S4 indicating one of the recording mode and the reproducing mode, and supplies the signal to the recording clock generating unit 10.

Based on the NRZI signal S3 received from the DVD encoder unit 20, the strategy converter 8 generates a recording pulse signal S5 according to a predetermined write strategy, and supplies the signal to the LD driver 7. As the write strategy, for example, there is known a multi-pulse-type write strategy formed by one top pulse and a number of multi-pulses corresponding to the recording data length. However, the present invention can be applied to various write strategies. The LD driver 7 drives the laser diode in the optical pickup 2, according to the recording pulse signal S5, to emit the recording laser light.

Based on the push-pull signal S1 supplied from the push-pull signal generating unit 4, the S/H pulse signal S2 supplied from the DVD encoder unit 20 and the recording/reproducing switching signal S4, the recording clock generating unit 10 generates the recording clock CK synchronized with the wobble signal included in the push-pull signal, and supplies the recording clock CK to the DVD encoder unit 20. It is noted that the recording clock generating unit 10 is a central section of the present invention, which will be explained in detail later.

The CPU 6 controls the whole operation of the information recording and reproducing apparatus 100. For example, during recording of the information, the CPU 6 controls the DVD encoder unit 20 and the servo signal generating unit 5 to record the recording data at a predetermined portion on the optical disc 1. By detecting the recording instruction and the reproducing instruction which a user inputs to an input device not illustrated and supplying those instructions to the DVD encoder unit 20, the CPU 6 enables the DVD encoder unit 20 to generate the recording/reproducing switching signal S4.

The reproducing system 9 includes a decoder which is not illustrated, and generates, as the reproducing signal, a sum total of the electric signals from four light-receiving elements of the photodetector. Then, the reproducing system 9 applies a necessary decoding process by the decoder to the reproducing signal to output the signal as reproducing data.

Rotation centers of the optical discs are often deviated due to irregularity in manufacturing and the like. It is called "eccentricity" of the optical disc. With the eccentricity, the linear speed of the track which the optical pickup 2 traces varies. However, in the above-mentioned configuration, since the recording clock signal is generated in synchronism with the wobble signal pre-recorded on the optical disc and performs the recording by utilizing the clock signal, desired data can be recorded at a desired position on the optical disc, irrespective of the variation of the liner speed caused by the eccentricity. Also, starting and ending positions of recording can be determined with high accuracy. Thereby, when data is additionally recorded next to an area in which the data has already been recorded, a useless area incapable of recording can be reduced, and high density recording can be realized.

Figure 2:
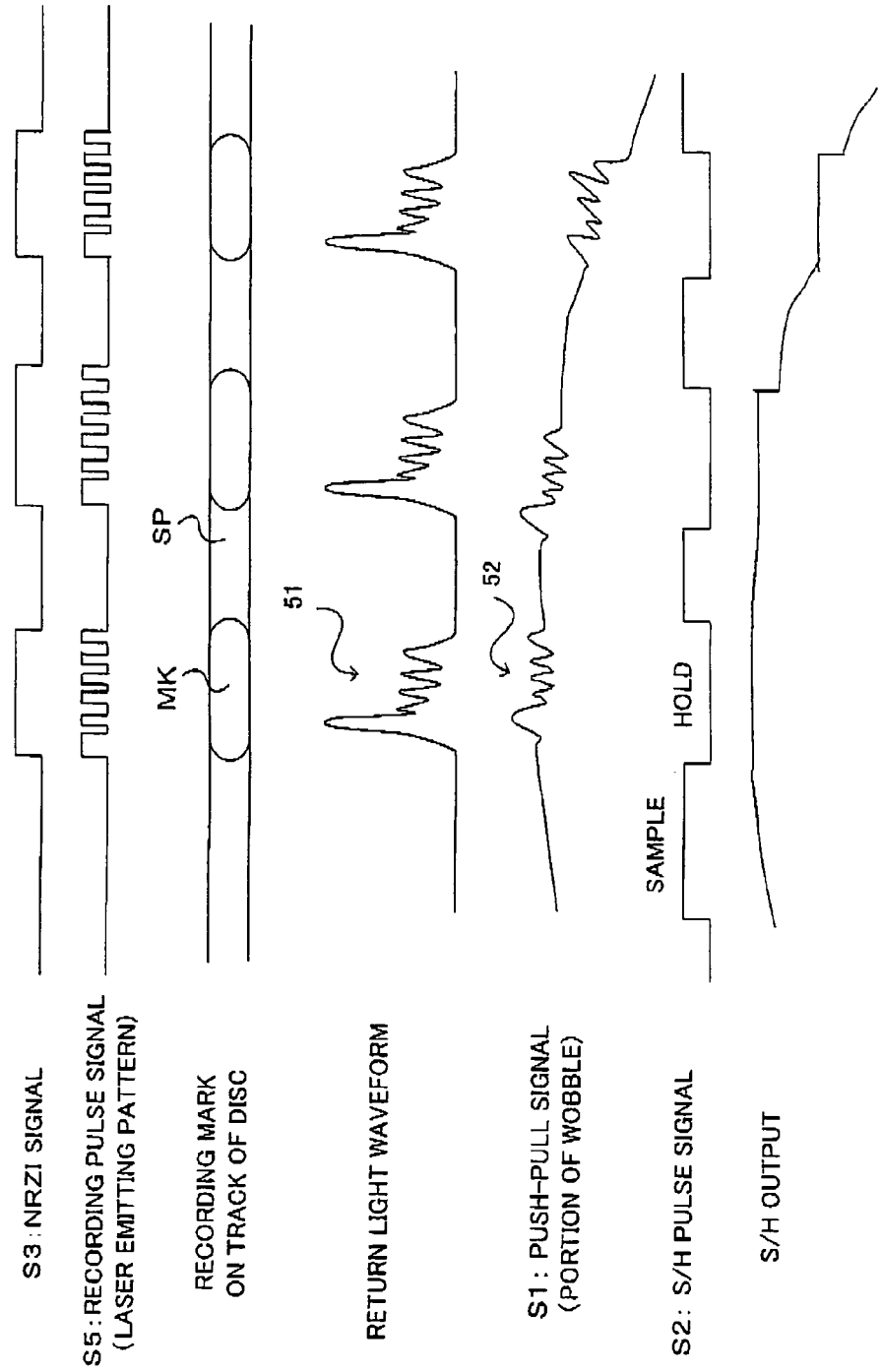
FIG. 2 is a diagram showing a waveform of each portion of the information recording and reproducing apparatus shown in FIG. 1.

Next, the waveform of each signal will be explained. FIG. 2 shows the waveform of each signal shown in FIG. 1. The example utilizes the above-mentioned multi-pulse-type write strategy. The recording pulse signal S5 formed by the top pulse and the plurality of multi-pulses are produced in correspondence to the NRZI signal S3. The laser diode emits laser light according to the recording pulse signal S5, and the recording marks having the mark portion and the space portion are formed on the disc.

In FIG. 2, a gradual level variation of the push-pull signal S1 indicates the wobble signal component. During recording of the information, since the laser light emitted from the laser diode is light-modulated by the pulse waveform of the recording pulse signal S5, as shown in FIG. 2, a return light waveform from the optical disc is light-modulated, too. Therefore, in a period corresponding to a mark portion MK of the recording mark, the return light waveform includes a waveform portion 51 corresponding to the recording pulse waveform S5, and the push-pull signal S1 includes the identical waveform portion 52. On the other hand, in a period corresponding to a space portion SP of the recording mark, the return light waveform does not include the modulated component by the recording pulse signal S5, and the level of the push-pull signal S1 is stable. Hence, during recording of the information, the push-pull signal S1 is sampled in the period corresponding to the space portion SP, and the sampled value is held in the period corresponding to the mark portion MK. Thereby, the recording clock signal is generated with removing the waveform portion 52. Therefore, the DVD encoder unit 20 generates, based on the recording data, the S/H pulse signal S2 whose level becomes an L-level in the period corresponding to the mark portion MK and becomes an H-level in the period corresponding to the space portion SP, and supplies the signal to the recording clock generating unit 10. Thereby, the S/H output, which is obtained by sampling and holding the push-pull signal S1 by the S/H pulse signal S2, becomes a signal which is not affected by the waveform portion 52 caused by the light modulation and which includes the wobble signal component as shown at the lower part of FIG. 2.

Figure 3:
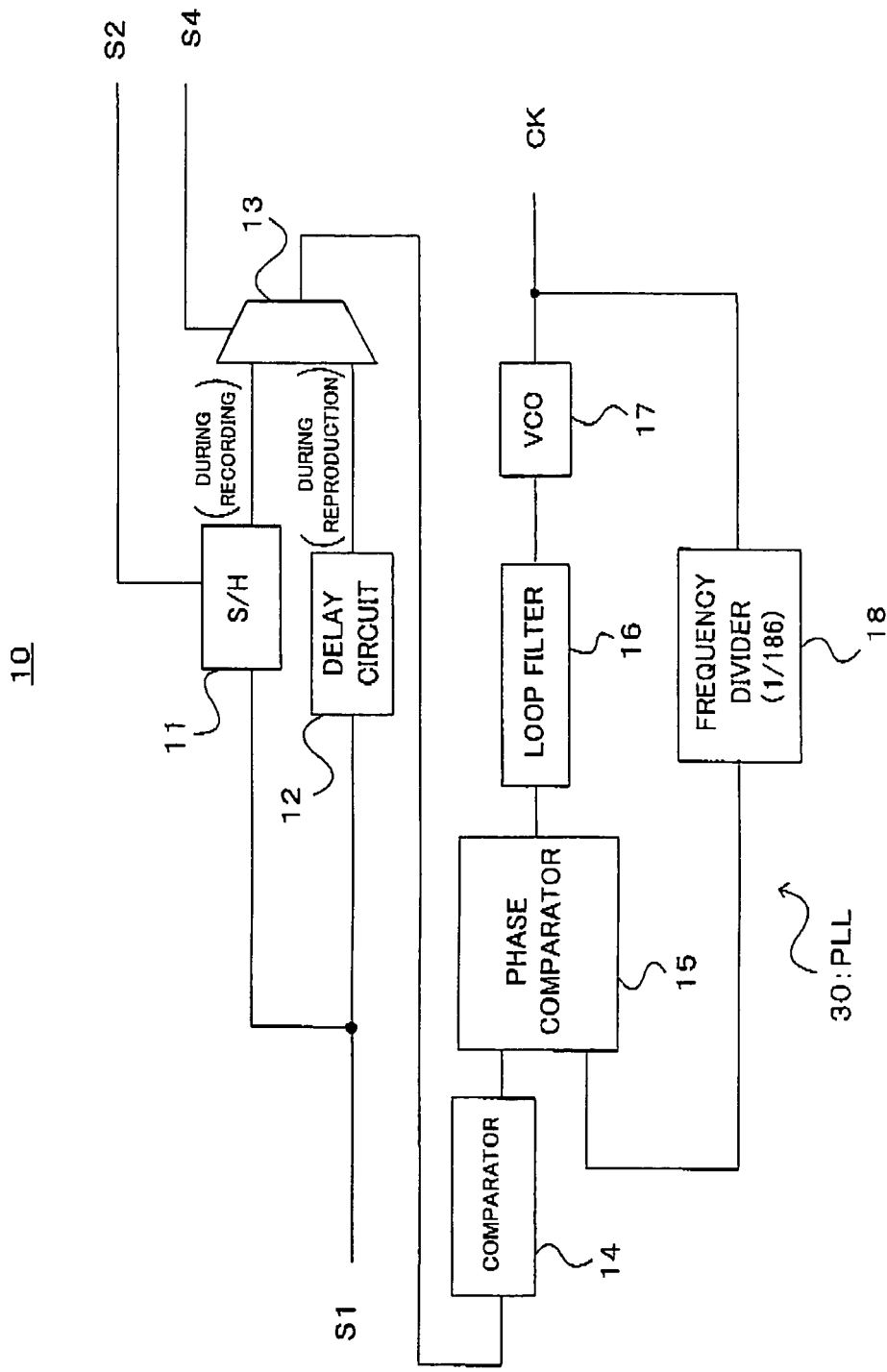
FIG. 3 is a block diagram showing a schematic configuration of a recording clock generating unit according to a first embodiment of the present invention.

Next, the recording clock generating unit 10 will be explained in detail. FIG. 3 shows a configuration of the recording clock generating unit 10 according to the first embodiment. As shown in FIG. 3, the recording clock generating unit 10 includes a sample-hold circuit 11, a delay circuit 12, a selector 13, a comparator 14, a phase comparator 15, a loop filter 16, a VCO (Voltage Controlled oscillator) 17, and a frequency divider 18.

The push-pull signal S1 from the push-pull signal generating unit 4 is supplied to the sample-hold circuit 11 and the delay circuit 12. It is noted that the level of the push-pull signal S1 varies according to the wobble frequency, and includes the wobble signal component. The sample-hold circuit 11 samples the push-pull signal S1 in the period corresponding to the space portion SP of the recording mark based on the S/H pulse signal S2 supplied from the DVD encoder unit 20, as explained with reference to FIG. 2, and holds the sampled value in the period corresponding to the mark portion MK to supply the value to the selector 13. On the other hand, the delay circuit 12 delays the push-pull signal S1 by a predetermined quantity, and supplies the signal to the selector 13.

The selector 13 supplies the push-pull signal outputted from the sample-hold circuit 11 to the comparator 14 during recording of the information, and supplies the push-pull signal outputted from the delay circuit 12 to the comparator 14 during reproduction of the information. The selector 13 performs the switching operation, based on the recording/reproducing switching signal S4 which is supplied from the DVD encoder unit 20. The comparator 14 generates a binary wobble signal (hereafter, it is simply called "wobble signal") by binarizing the push-pull signal supplied from the selector 13 by utilizing a predetermined threshold value, and transmits the signal to the phase comparator 15.

The phase comparator 15, the loop filter 16, the VCO 17 and the frequency divider 18 constitute a PLL (Phase Lock Loop) which generates the recording clock signal synchronized with the wobble signal. The VCO 17 is an oscillator which oscillates at the frequency corresponding to an inputted control voltage. The oscillating frequency is high when the control voltage is high, and the oscillating frequency is low when the control voltage is low. For example, the oscillating frequency is 26.16 MHz at the once linear speed of a DVD-R. The frequency divider 18 frequency-divides the output signal having this frequency by $\frac{1}{186}$, and generates a signal of 140.65 KHz equal to the wobble frequency to supply it to the phase comparator 15. The phase comparator 15 compares the phases of the output signals of the frequency divider 18 and the comparator 14. When the phase of the output signal of the frequency divider 18 is ahead of the phase of the output signal of the comparator 14, a low voltage is outputted to the loop filter 16. On the other hand, when the phase of the output signal of the frequency divider 18 is behind the phase of the output signal of the comparator 14, a high voltage is outputted to the loop filter 16. The loop filter 16, which is a low pass filter, supplies, as a control voltage, a DC component of the phase difference output signal from the phase comparator 15 to the VCO 17. By the above-mentioned PLL, the output signals of the comparator 14 and the frequency divider 18 are controlled to have a constant phase difference. As a result, the recording clock CK is synchronized with the wobble signal. Therefore, by utilizing the recording clock CK synchronized with the wobble signal detected from the optical disc, the recording data can be recorded on the optical disc.

Figure 4:
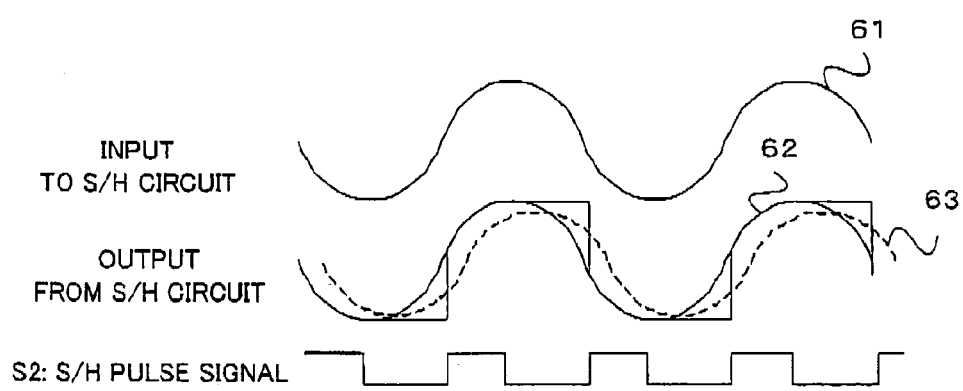
FIG. 4 is a diagram explaining a phase delay caused by a sample-hold circuit.

Next, the description will be given of an operation of the delay circuit 12 in the recording clock generating unit 10. The delay circuit 12 has operation for adjusting the phase of the wobble signal during reproduction in correspondence to the phase delay of the wobble signal caused by the sample-hold circuit 11 during recording. FIG. 4 schematically shows the phase delay of the wobble signal caused by the sampling by the sample-hold circuit 11. In FIG. 4, a waveform 62 shows the signal which is formed by sampling and holding an input signal waveform 61 whose frequency is equal to the wobble frequency (140.65 KHz) supplied to the sample-hold circuit 11, by the S/H pulse signal S2. The wobble component therein (fundamental wave component: 140.65 KHz) is indicated by a waveform 63 of a broken line. As understood in FIG. 4, the phase of the wobble signal waveform 63 after the sample-hold process by the sample-hold circuit 11 has a delay with respect to the wobble signal waveform 61 before the sample-hold process. The phase delay is caused by the sampling process by the sample-hold circuit 11.

As shown in FIG. 3, the sample-hold process of the wobble signal is executed by the sample-hold circuit 11 only during recording, and is not executed during reproduction. Therefore, unless the phase adjustment of the wobble signal inputted to the comparator 14 during reproduction is executed, a phase difference occurs between the wobble signal utilized for generating the recording clocks during recording and the wobble signal utilized for generating the recording clocks during reproduction. Therefore, for example, in the information recording and reproducing apparatus, a temporary frequency variation occurs to the recording clock signal when the recording is started by changing the mode from the reproducing mode to the recording mode.

FIG. 5 schematically shows this situation. At time t1, when the mode of the information recording and reproducing apparatus is switched from the reproducing mode to the recording mode, the selector 13 switches the wobble signal supplied to the comparator 14 from the wobble signal outputted from the delay circuit 12 to the wobble signal outputted from the sample-hold circuit 11. If the delay quantity of the delay circuit is zero (i.e., the delay circuit does not exist), the phase delay occurs to the wobble signal waveform supplied to the comparator 14 immediately after time t1, as shown in FIG. 5. Therefore, since the PLL 30 formed by the phase comparator 15 and the like follows the phase deviation, and the frequency of the recording clock CR instantaneously largely varies immediately after time t1, as shown below in FIG. 5. Afterward, if the PLL 30 establishes a phase synchronization around time t2, the frequency of the recording clock CK is stabilized again. However, between times t1 and t2, the frequency of the recording clock CK largely varies, and becomes unstable. Thus, the information recording becomes unstable by the variation of the recording clock CK, as long as the situation continues. Therefore, the delay circuit 12 gives a predetermined quantity of phase delay to the wobble signal for correcting the phase deviation.

Figure 6A:
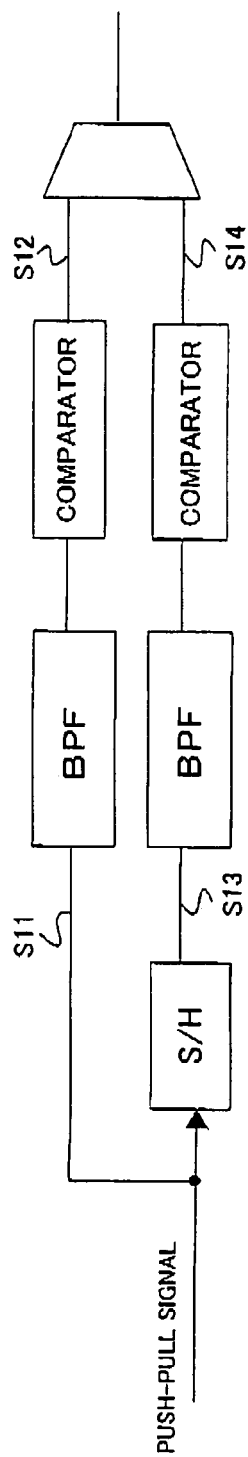
FIGS. 6A and 6B are diagrams explaining a method of determining a delay quantity set in a delay circuit.
Figure 6B:
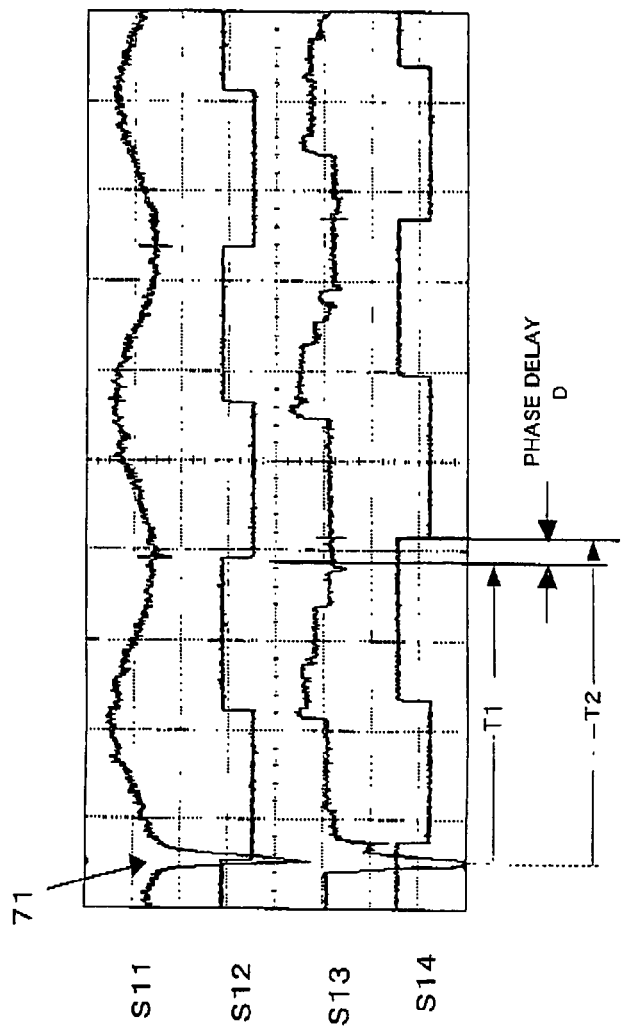

Next, the delay quantity of the delay circuit 12 will be explained. FIGS. 6A and 6B show waveform examples of the wobble signals when the sample-hold process is executed and not executed. Concretely, as shown in FIG. 6A, the fundamental wave components of the wobble signals are extracted by respectively inputting the sample-hold wobble signal S13 and the non-sample-hold wobble signal S11 to a band pass filter, and the fundamental wave component is binarized by the comparator to obtain signals S14 and S12. FIG. 6B shows the waveform example of each signal S11 to S14.

As shown in FIG. 6B, the phase delay of time width D occurs to the sample-hold signal S14, compared with the non-sample-hold signal S12. It is noted that the waveform examples in FIG. 6B are of the DVD-R, and a portion 71 of the waveform corresponds to the land prepit (LPP). Therefore, the delay quantity of the delay circuit 12 shown in FIG. 3 may be the phase delay quantity caused by the sample-hold circuit 11, i.e., the time width D.

Figure 7A:
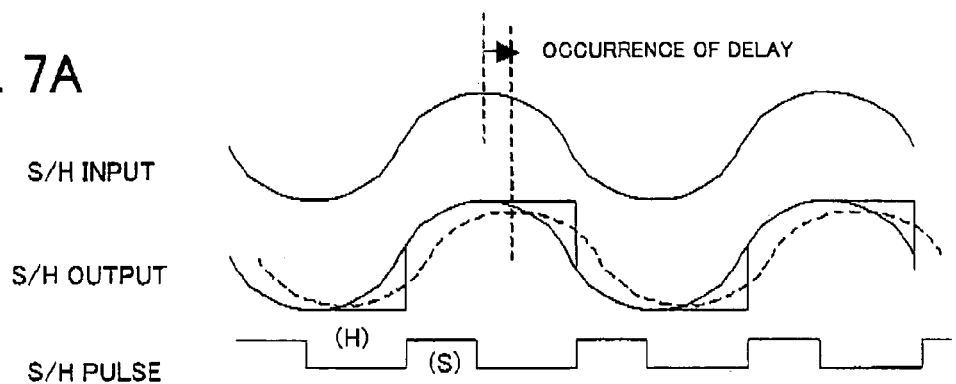
FIGS. 7A to 7C are diagrams showing a relation between a delay quantity set in a delay circuit and a sample-hold period.
Figure 7B:
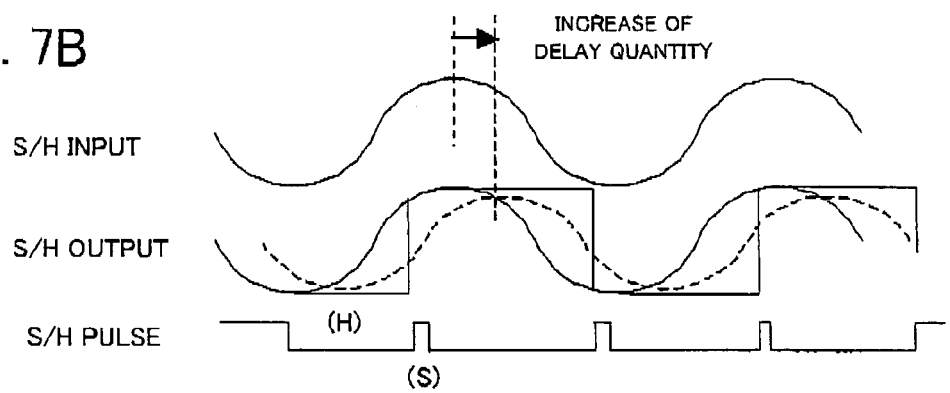
Figure 7C:
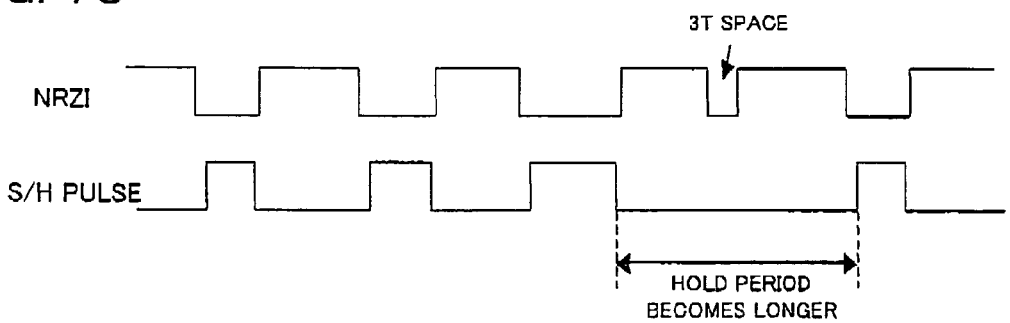

The delay quantity of the delay circuit 12 can be determined in association with a hold period of the sample-hold circuit 11. Concerning this point, FIGS. 7A to 7C show a relation between the hold period of the sample-hold circuit and the phase delay quantity. As understood by comparing FIGS. 7A and 7B, as the hold period is longer, the quantity of the phase delay caused by the sample-hold process is larger. Though the length of the hold period is preset in the information recording and reproducing apparatus, the preset length of the hold period differs between different recording speeds. For example, as for the DVD-R/RW, though a recording mark length and a recording space length 3T to 11T and 14T exist ("T" is the time width of one-wave of a channel bit clock (recording clock)), the sampling by the sample-hold circuit can not be performed in a short space period, such as 3T space, when the time width of 1T is shortened in high-speed recording. In that case, as shown in FIG. 7C, the hold period can be set longer. Therefore, for example, it is effective that the different delay quantity of the delay circuit 12 is set in association with a pattern of the sample-hold process in correspondence to the recording speed.

As a method of setting the delay quantity of the delay circuit 12, the delay quantity D is predetermined based on the measurement illustrated with reference to FIGS. 6A and 6B, and the quantity may be set in the delay circuit 12 as an invariable quantity. In that case, some different delay quantities may be prepared corresponding to the hold periods in the sample-hold circuit, as explained above.

On the other hand, it is possible that the delay quantity D of the delay circuit is not fixed, but kept updated, based on the value measured during recording, while recording is performed. It is noted that "during recording" includes a case of executing only the sample-hold process without actually recording information on the disc. For example, an example thereof is described below. As understood in FIG. 6B, in both cases when the sample-hold process is executed and not executed, the phase delay does not occur to a detected waveform of the LPP (portion 71). In that case, delay times (T1 and T2 in FIG. 6B) from an LPP detection position are respectively detected during recording, and a difference thereof D (=T2−T1) may be calculated to set the difference to the delay circuit. In that case, the delay quantity D can be updated at every predetermined time period during reproduction.

Figure 8:
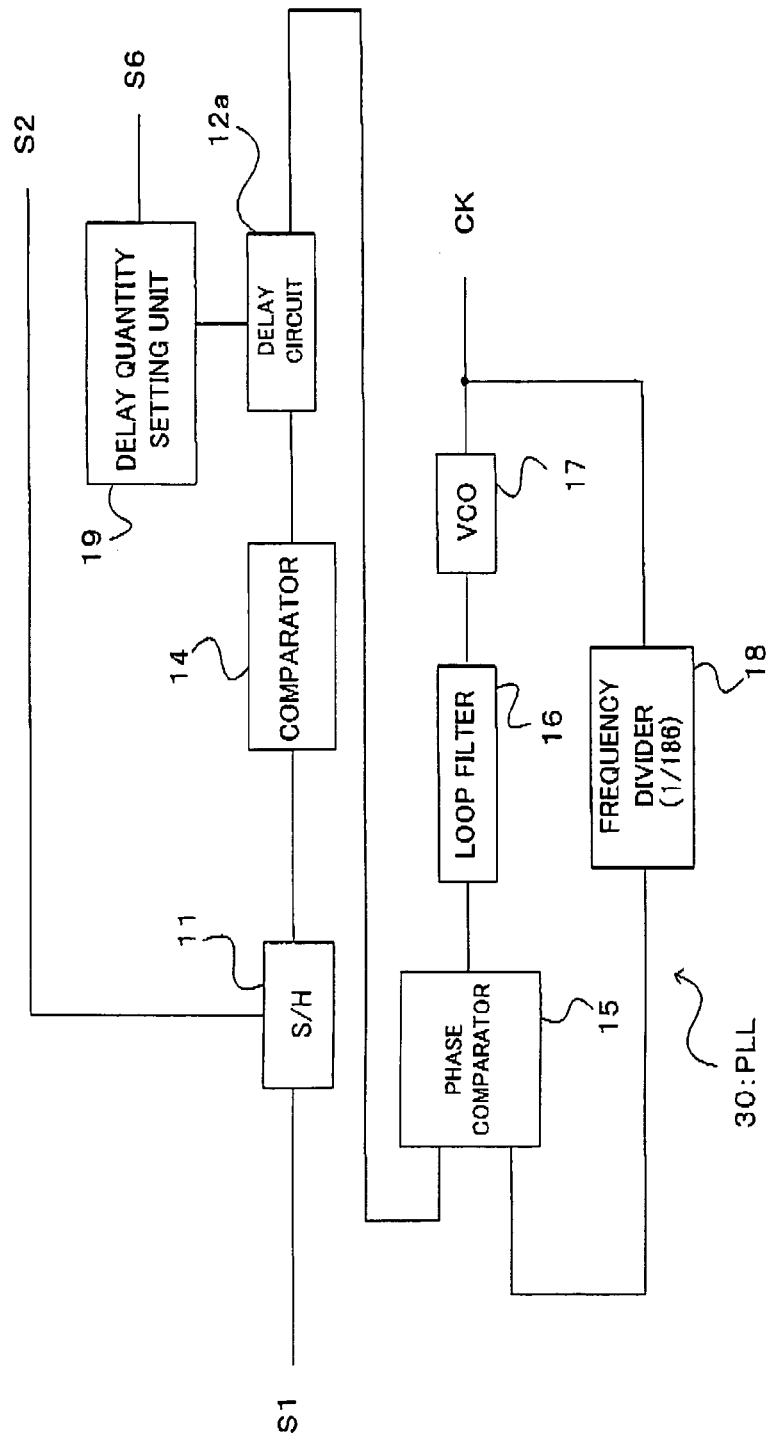
FIG. 8 is a block diagram showing a schematic configuration of a recording clock generating unit according to a modification of the first embodiment of the present invention.

Next, the modification of the first embodiment will be explained with reference to FIG. 8. FIG. 8 shows a configuration of a recording clock generating unit 10a according to the modification of the first embodiment. It is noted that the identical reference numerals are given to identical components to those of the recording clock generating unit 10 shown in FIG. 3.

In this modification, a delay circuit 12a is provided at a subsequent stage of the comparator 14, and the delay process is applied to a digital signal which is binarized by the comparator 14. The delay quantity of the delay circuit 12a is set by a delay quantity setting unit 19. The delay quantity setting unit 19 sets the delay quantity based on the control signal S6 from the CPU 6. The PLL 30 including the phase comparator 15, the loop filter 16, the VCO 17 and the frequency divider 18 is formed identically to the case in FIG. 3.

During recording, based on the control signal S6 from the CPU 6, the delay quantity setting unit 19 sets the delay quantity of the delay circuit 12a to zero (i.e., no delay) The sample-hold circuit 11 samples and holds the push-pull signal S1 based on the S/H pulse signal S2, and supplies the signal to the comparator 14. The comparator 14 binarizes the sample-hold push-pull signal S1, and the delay circuit 12a gives the delay of the delay quantity (=0 in this case) to the wobble signal obtained by the binarization.

On the other hand, during reproduction, the delay quantity setting unit 19 sets the delay quantity of the delay circuit 12a to D based on the control signal S6 from the CPU 6. The S/H pulse signal S2 is fixed to the level indicating the sampling (i.e., the H-level in the example of FIG. 2) during reproduction Thereby, since the sample-hold circuit 11 does not execute the holding, the push-pull signal S1 is substantially binarized, as it is, in the comparator 14, and is delayed by the delay circuit 12a only by the delay quantity D to be inputted to the phase comparator 15. In that case, the CPU 6 receives the recording/reproducing switching signal S4 from the DVD encoder unit 20, and generates the control signal S6 to be supplied to the delay quantity setting unit 19 (see the signals S4 and S6 indicated by the wave lines in FIG. 1) based on the recording/reproducing switching signal S4.

The PLL 30 operates identically to the case of FIG. 3. As explained above, the recording clock CK is generated based on the sample-hold push-pull signal S1 during recording, and based on the non-sample-hold push-pull signal S1 during reproduction. Therefore, the process identical to the recording clock generating unit 10 shown in FIG. 3 is executed. In this modification, the delay process is executed after the push-pull signal is converted to a digital signal by the binarization by the comparator 14. Therefore, it is advantageous that the recording clock generating unit can be formed with lower cost than a case of utilizing an analog delay circuit 12.

[2nd Embodiment]

Next, the second embodiment of the present invention will be explained. In the above-mentioned first embodiment, correspondingly to the phase delay caused by sampling and holding the push-pull signal during recording, the phase of the push-pull signal during recording and reproduction is adjusted by giving the phase delay by the delay circuit during reproduction. On the other hand, in the second embodiment, the phase delay caused by sampling and holding is corrected inside the PLL, instead of providing the delay circuit.

Figure 9:
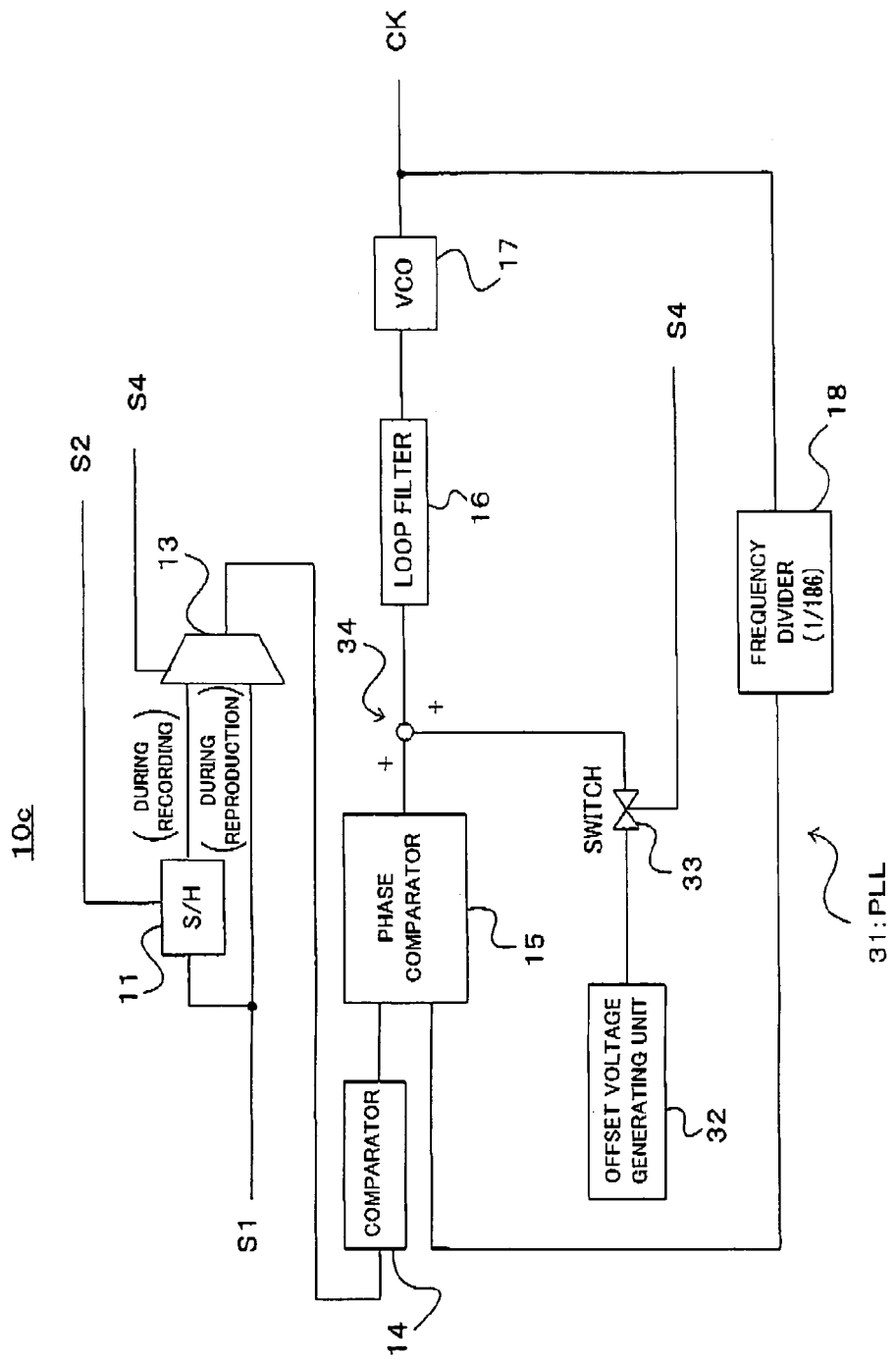
FIG. 9 is a block diagram showing a schematic configuration of a recording clock generating unit according to a second embodiment of the present invention.

FIG. 9 shows the configuration of the recording clock generating unit 10c. It is noted that the identical components to those in the recording clock generating unit 10 of the first embodiment shown in FIG. 3 is denoted by the identical reference numerals. As understood by the comparison with FIG. 3, the recording clock generating unit 10c is different from the recording clock generating unit 10 shown in FIG. 3 in the configuration of the PLL 31. Namely, the push-pull signal whose phase is delayed by the sample-hold circuit 11 is inputted to the comparator 14 via the selector 13 during recording, and the push-pull signal without delay is inputted to the comparator 14 via the selector 13.

On the other hand, the PLL 31 includes an offset voltage generating unit 32, a switch 33 and an adder 34, in addition to the phase comparator 15, the loop filter 16, the VCO 17 and the frequency divider 18. The offset voltage generating unit 32 generates a predetermined offset voltage. The predetermined offset voltage is set, in advance, to be a predetermined value which corresponds to the phase delay caused by the sample-hold circuit 11. The switch 33 supplies the offset voltage generated by the offset voltage generating unit 32 based on the recording/reproducing switching signal S4 inputted by the DVD encoder unit 20 during recording, and does not supply the offset voltage to the adder 34.

Next, the operation of the PLL 31 will be explained. During reproduction, the push-pull signal without delay is inputted to the comparator 14 via the selector 13, and is binarized by the comparator 14 to be inputted to the phase comparator 15. Therefore, there is no large difference between the output signal from the comparator 14 and the output signal from the frequency divider 18. During reproduction, the offset voltage is not supplied to the adder 34, and the PLL operates in the same manner as the case of the first embodiment shown in FIG. 3, and the recording clock CK synchronized with the wobble signal is generated.

On the other hand, during recording, the selector 13 supplies the output signal of the sample-hold circuit 11, i.e., the push-pull signal having the phase delay, to the comparator 14. Therefore, as a result of the phase comparison in the phase comparator 15, the signal having the voltage level corresponding to the phase difference of the quantity equal to the phase delay is inputted from the phase comparator 15 to the adder 34. However, during recording, the offset voltage which the offset voltage generating unit 32 generates is inputted to the adder 34 via the switch 33. As explained above, since the value of the offset voltage is preset to the value corresponding to the phase delay caused by the sample-hold circuit 11, the phase difference of the output signal of the phase comparator is cancelled by the addition of the offset voltage in the adder 43. Namely, by the addition of the offset voltage, the output voltage level of the adder 34 is always constant during recording and reproducing. Thereby, the PLL 31 establishes the phase synchronization, and the recording clock CK is synchronized with the wobble signal during recording.

In that way, it becomes possible that the effect of the phase delay caused by the sample-hold circuit 11 is removed, and the recording clock CK synchronized with the wobble signal is outputted during recording and reproducing. Therefore, even at the time of switching from the reproducing mode to the recording mode, the variation of the recording clock CK and deterioration of the recording accuracy can be prevented.

[3rd Embodiment]

Next, the third embodiment of the present invention will be explained. The third embodiment is for correcting the phase delay caused by the sample-hold circuit 11 inside the PLL, identically to the second embodiment. However, the third embodiment is different from the second embodiment in that a phase shifter is provided inside the PLL.

Figure 10:
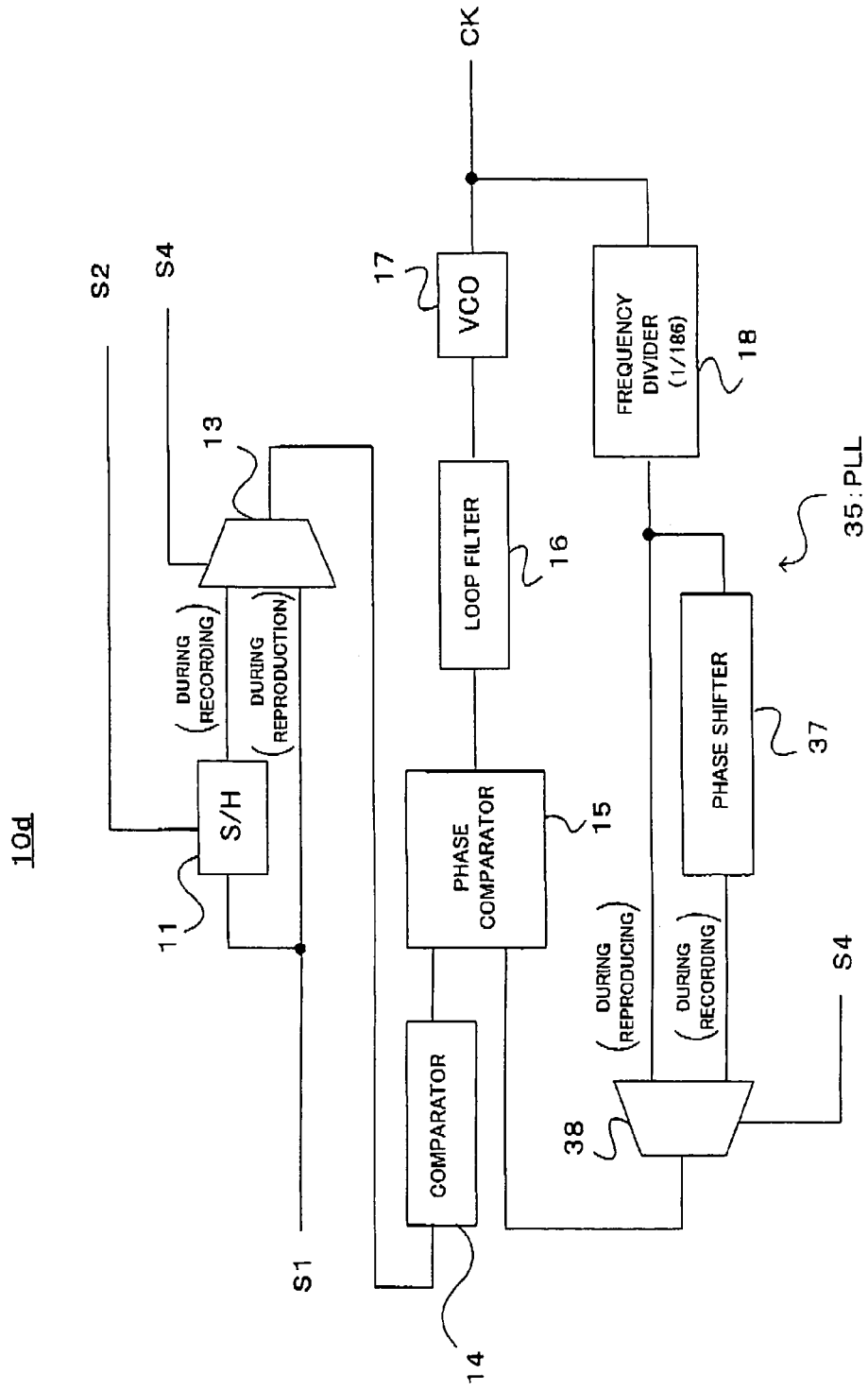
FIG. 10 is a block diagram showing a schematic configuration of a recording clock generating unit according to a third embodiment of the present invention.

FIG. 10 shows a configuration of a recording clock generating unit 10d according to the third embodiment. The identical numeral references are given to the components identical to those in the recording clock generating unit 10 in the first embodiment shown in FIG. 3. As understood by comparing with FIG. 3, the recording clock generating unit 10d in the third embodiment is different from the recording clock generating unit 10 of the first embodiment shown in FIG. 3, in the configuration of the PLL 35.

The PLL 35 includes the phase comparator 15, the loop filter 16, the VCO 17, the frequency divider 18, and additionally, a phase shifter 37 and a selector 38. The phase shifter 37 delays the phase of the output signal of the frequency divider 18 by the phase delay quantity caused by the sample-hold circuit 11. The recording/reproducing switching signal S4 is inputted to the selector 38, and the output signal of the frequency divider 18 is supplied, as it is, to the phase comparator 15 during reproduction. During recording, the output signal of the phase shifter 37 is supplied to the phase comparator 15.

Next, an operation of the PLL 35 will be explained. During reproduction, the push-pull signal without the phase delay is inputted to the comparator 14. Therefore, the PLL 35 operates identically to the PLL 30 in the first embodiment.

On the other hand, during recording, the push-pull signal having the phase delay caused by the sample-hold circuit 11 is binarized in the comparator 14, and is inputted to the phase comparator 15. However, during recording, by the phase shifter 37, the phase delay equal to the phase delay caused by the sample-hold circuit 11 is given to the output signal of the frequency divider 18, and the output signal with the phase delay is inputted to the phase comparator 15. Therefore, two input signals of the phase comparator 15 respectively have the phases which have the phase delay caused by the sample-hold circuit 11 with respect to the push-pull signal S1, and the input to the loop filter 16 is kept to the constant voltage. Thus, the phase synchronization by the PLL 35 is established, and the recording clock CK is synchronized with the wobble signal.

In that way, it becomes possible that the phase delay caused by the sample-hold circuit 11 is removed, and the recording clock CK synchronized with the wobble signal is outputted during recording and reproducing. Therefore, at the time of switching from the reproducing mode to the recording mode, both the fluctuation of the recording clock CK and the deterioration of the recording precision can be prevented.

[Modification]

Figure 11:
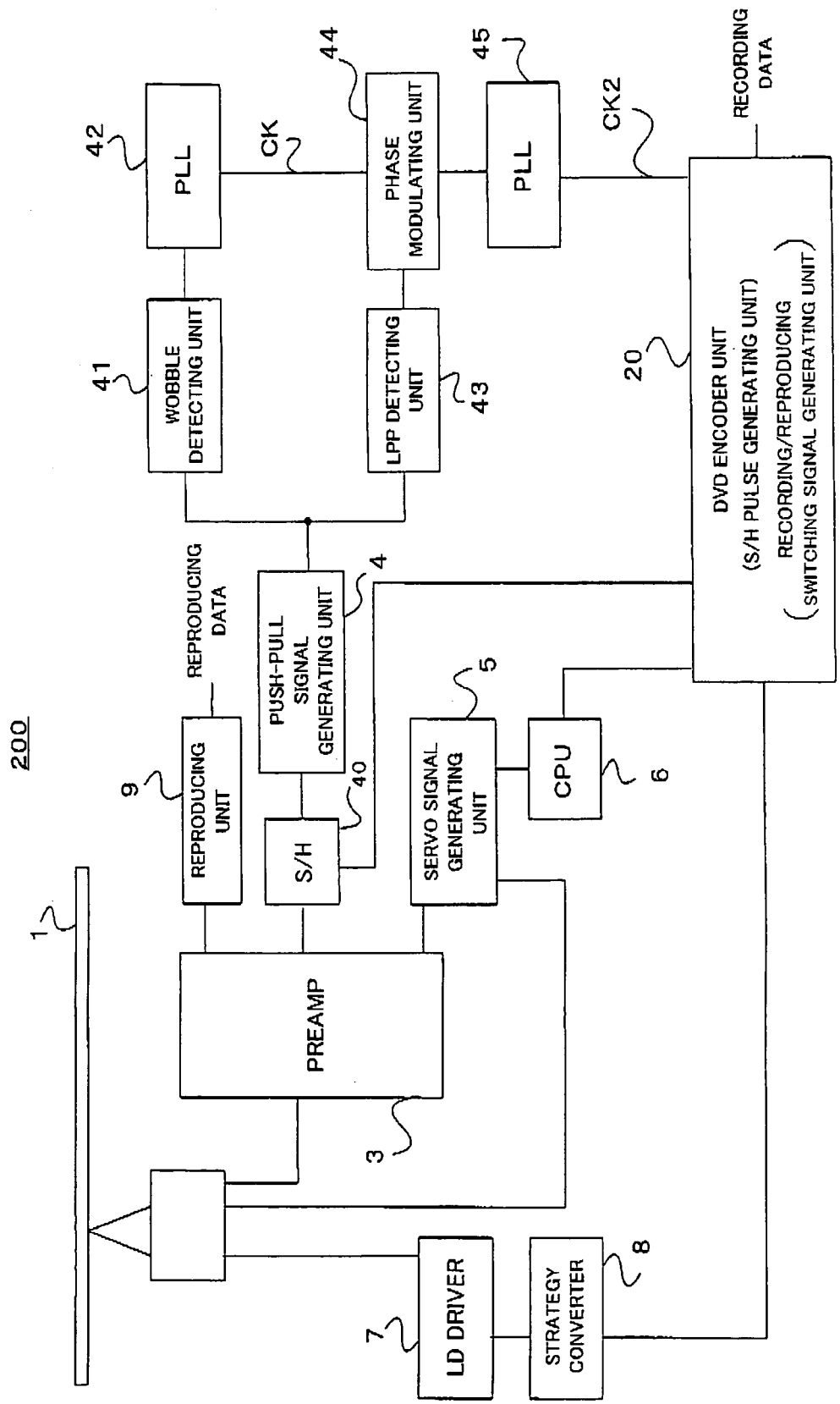
FIG. 11 is a block diagram showing a schematic configuration of a modification of an information recording and reproducing apparatus.

Next, the modification of the information recording and reproducing apparatus will be explained. FIG. 11 shows a configuration of the modification of the information recording and reproducing apparatus to which the present invention is applied. It is noted that the identical reference numerals are given to the components identical to those in the information recording and reproducing apparatus 100 shown in FIG. 1.

In the example, the recording clock CK is generated by utilizing two PLLs. A first PLL 42 generates the recording clock CK based on the wobble signal, and a second PLL 45 adjusts the phase of the recording clock CK based on the LPP.

The description will now be given of a different point from the information recording and reproducing apparatus 100 shown in FIG. 1. First, in the modification, the output signal of a preamplifier 3 is supplied to the push-pull signal generating unit 4 after being sampled and held by the sample-hold circuit 40. The modulating component of the return light, which has already been explained with reference to FIG. 2 is removed from the push-pull signal. The phase delay occurs to the push-pull signal during recording, due to the sample-hold circuit 40.

The push-pull signal outputted from the push-pull signal generating unit 4 is supplied to the wobble detecting unit 41 and the LPP detecting unit 43. The wobble detecting unit 41 corresponds to the comparator 14 shown in FIG. 3, and generates the wobble signal to supply it to the first PLL 42. The first PLL 42 corresponds to each PLL 30, 31 and 35 in the above-mentioned first to third embodiments, and generates the recording clock CK synchronized with the wobble signal to output it to a phase modulating unit 44. Therefore, the recording clock CR outputted from the first PLL 42 to which the present invention is applied is stable without the fluctuation even at the recording start time.

On the other hand, the LPP detecting unit 43 detects the LPP from the push-pull signal, and inputs the LPP to the phase modulating unit 44. According to the recording format of the DVD-R and the like, the LPP exists for each predetermined period of the wobble signal. Therefore, the phase modulating unit 44 adjusts the phase of the recording clock CK based on the LPP detecting signal, and supplies the phase to the second PLL 45. Thereby, the second PLL 45 generates a recording clock CK2 synchronized with the wobble signal and the LPP detecting signal, and supplies the clock CK2 to the DVD encoder unit 20.

In that way, the recording clock generating unit, which generates the recording clock synchronized with the wobble signal according to the present invention, can be used with the PLL utilizing the LPP detecting signal.

The invention may be embodied on other specific forms without departing from the spirit or essential characteristics thereof. The present embodiments therefore to be considered in all respects as illustrative and not restrictive, the scope of the invention being indicated by the appended claims rather than by the foregoing description and all changes which come within the meaning an range of equivalency of the claims are therefore intended to embraced therein.

The entire disclosure of Japanese Patent Application No. 2003-146679 filed on May 23, 2003 including the specification, claims, drawings and summary is incorporated herein by reference in its entirety.

What is claimed is:

1. An information recording and reproducing apparatus of an optical disc comprising a recording track wobbled by a predetermined frequency, comprising:
    an optical pickup which irradiates a laser light on the optical disc and receives the laser light reflected by the optical disc to output an electric signal corresponding to the laser light;
    a push-pull signal generating unit which includes a sample-hold unit for executing sample-hold process, and generates a non-sample-hold push-pull signal and a sample-hold push-pull signal from the electric signal, the push-pull signal including a wobble signal component of the recording track;
    a recording clock generating unit which generates a recording clock synchronized with the wobble signal based on the sample-hold push-pull signal during recording and based on the non-sample-hold push-pull signal during reproduction; and
    a phase adjusting unit which adjusts phases of the non-sample-hold push-pull signal and the sample-hold push-pull signal.

2. The information recording and reproducing apparatus according to claim 1, wherein the phase adjusting unit comprises a delay circuit which delays the non-sample-hold push-pull signal by a delay quantity corresponding to a phase delay quantity caused by the sample-hold process.

3. The information recording and reproducing apparatus according to claim 2, further comprising a switching unit which supplies the sample-hold push-pull signal to the recording clock generating unit during recording, and supplies an output signal of the delay circuit to the recording clock generating unit during reproduction.

4. The information recording and reproducing apparatus according to claim 2, wherein the delay quantity of the delay circuit is set in association with a hold period in the sample-hold process.

5. The information recording and reproducing apparatus according to claim 2, wherein the phase adjusting unit comprises:
    a unit which measures the phase delay quantity caused by the sample-hold process during recording; and
    a unit which sets the delay quantity of the delay circuit based on the measured phase delay quantity.

6. The information recording and reproducing apparatus according to claim 1,
wherein the recording clock generating unit comprises a wobble signal generating unit which generates the wobble signal from the push-pull signal, and a PLL circuit which generates the clock signal synchronized with the wobble signal;
wherein the PLL circuit comprises a phase comparator which compares the phases of the wobble signal and a frequency dividing signal of the recording clock signal, and an oscillator which varies a frequency of the recording clock signal in accordance with the output signal of the phase comparator; and
wherein the phase adjusting unit comprises an adder which adds, to the output signal of the phase comparator, an offset voltage corresponding to the phase delay quantity caused by the sample-hold process during recording.

7. The information recording and reproducing apparatus according to claim 1,
wherein the recording clock generating unit comprises a wobble signal generating unit which generates the wobble signal from the push-pull signal, and a PLL circuit which generates the clock signal synchronized with the wobble signal;
wherein the PLL circuit comprises a phase comparator which compares the phases of the wobble signal and a frequency dividing signal of the recording clock signal, and an oscillator which varies a frequency of the recording clock signal in accordance with the output signal of the phase comparator; and
wherein the phase adjusting unit comprises a phase shifter which shifts the phase of the frequency dividing signal by the phase quantity corresponding to the phase delay quantity caused by the sample-hold process during recording.

8. The information recording and reproducing apparatus according to claim 1, wherein the push-pull signal generating unit generates the push-pull signal from the electric signal, and samples and holds the generated push-pull signal by the sample-hold unit to generate the sample-hold push-pull signal.

9. The information recording and reproducing apparatus according to claim 1, wherein the push-pull signal generating unit samples and holds the electric signal by the sample hold unit to generate a sample-hold electric signal, and generates the sample-hold push-pull signal from the sample-hold electric signal.

* * * * *